United States Patent
Lee et al.

(10) Patent No.: US 8,466,710 B2
(45) Date of Patent: Jun. 18, 2013

(54) CIRCUIT FOR RESTRAINING SHOOT THROUGH CURRENT

(75) Inventors: Li-Min Lee, New Taipei (TW);
Chung-Che Yu, New Taipei (TW)

(73) Assignee: Green Solution Technology Co., Ltd., New Taipei (TW)

(*) Notice: Subject to any disclaimer, the term of this patent is extended or adjusted under 35 U.S.C. 154(b) by 62 days.

(21) Appl. No.: 13/225,565

(22) Filed: Sep. 6, 2011

(65) Prior Publication Data

US 2012/0068731 A1   Mar. 22, 2012

(30) Foreign Application Priority Data

Sep. 21, 2010  (TW) ............................... 99131914 A

(51) Int. Cl.
*H03K 19/003* (2006.01)
(52) U.S. Cl.
USPC .......................................................... 326/34
(58) Field of Classification Search
None
See application file for complete search history.

(56) References Cited

U.S. PATENT DOCUMENTS

| 5,541,541 A * | 7/1996 | Salamina et al. | 327/108 |
| 7,265,591 B1 * | 9/2007 | Petrofsky | 327/108 |

* cited by examiner

*Primary Examiner* — Crystal L Hammond
(74) *Attorney, Agent, or Firm* — CKC & Partners Co., Ltd.

(57) ABSTRACT

A circuit for restraining a shoot through current comprises a master selecting unit and a logic unit. The master selecting unit receives an input signal, and outputs first and second master selecting signals. The logic unit comprises first and second logic elements which generate first and second control signals for controlling two transistor switches connected in series. The first and second logic elements change the logic states of the first and second control signals according to the first and second master selecting signals. When the input signal is at a first logic level, the first logic element acquires a control privilege to change the logic state of the first control signal and trigger the second logic element to change the logic state of the second control signal. When the input signal is at a second logic, the second logic element acquires the control privilege.

13 Claims, 2 Drawing Sheets

CIRCUIT FOR RESTRAINING SHOOT THROUGH CURRENT

RELATED APPLICATIONS

This application claims priority to Taiwan Application Serial Number 099131914, filed Sep. 21, 2010, which is herein incorporated by reference.

BACKGROUND

1. Technical Field

The present invention relates to a circuit for restraining a shoot through current, and more particularly a circuit for controlling a driving sequence according to an input signal.

2. Description of Related Art

The conventional power circuit commonly has two transistor switches connected in series between a power supply and a ground, and the conventional power circuit controls the states of the two transistor switches to adjust the power inputted from the power supply. In general, the one at an upper arm of the two transistor switches (referred as the upper-arm transistor switch hereinafter) is a P-type MOSFET, and the one at a lower arm thereof (referred as the lower-arm transistor switch hereinafter) is an N-type MOSFET. Ideally, an input signal can be used to simultaneously control the states of two transistor switches to be ON or OFF. When the input signal is at a low level, the upper-arm transistor switch is switched on and the lower-arm transistor switch is switched off, such that the power of the power supply is transmitted to a rear stage via the on and off of the upper-arm transistor. When the input signal is at a high level, the upper-arm transistor switch is switched off and the lower-arm transistor switch is switched on, thereby stop transmitting the power of the power supply.

However, since the transistor switch cannot be promptly switched between the on state and the off state when an actual circuit is in operation, a shoot through current may be caused to flow to ground through the two transistor switches during the two transistor switches being switched between the on state and the off state, thus resulting in switching loss. Especially when the shoot through current is too larger or lasts too long, the transistor switch may be at risk of burnout due to overheat. Therefore, it is a major consideration in designing a control circuit regarding how to switch the two transistor switches in the control circuit for decreasing the power consumption caused by the shoot through current and meanwhile avoiding damaging the transistor switch.

SUMMARY

An object of the present invention is to provide a circuit for restraining a shoot through current, which controls a switching sequence of two transistor switches connected in series to avoid the power consumption or even the damage of the transistor switches resulted from too large shoot through current or prolonged switching time caused by simultaneously turning on the two transistor switches.

To accomplish the aforementioned object, an exemplary embodiment of the invention provides a circuit for restraining a shoot through current, the circuit comprising a master selecting unit and a logic unit. The master selecting unit receives an input signal that is at a first logic level or a second logic level, and outputs a first master selecting signal and a second master selecting signal in response to the input signal. The logic unit comprises a first logic element and a second logic element, which respectively generate a first control signal and a second control signal for controlling two transistor switches connected in series. The first logic element and the second logic element changes the logic states of the first control signal and second control signal respectively according to the first master selecting signal and the second master selecting signal. When the input signal is at the first logic, the first logic element acquires a control privilege to change the logic state of the first control signal and trigger the second logic element to change the logic state of the second control signal. When the input signal is at the second logic, the second logic element acquires the control privilege to change the logic state of the second control signal and trigger the first logic element to change the logic state of the first control signal.

Furthermore, another exemplary embodiment of the invention provides a circuit for restraining shoot through current, the circuit comprising a logic unit and a priority determining unit. The logic unit comprises a first logic element and a second logic element, which respectively generate a first control signal and a second control signal for controlling two transistor switches connected in series. The priority determining unit receives an input signal that is at a first logic level or a second logic level, and determines one of the first logic level and the second logic level as a priority logic element according to the level of the input signal, and enables the priority logic element to change the logic state of the control signal corresponding thereto for switching off the transistor switch corresponding thereto.

Embodiments of the invention have the advantages of avoiding the power consumption or even the damage of the transistor switches resulted from too large shoot through current or prolonged switching time caused by simultaneously turning on the two transistor switches, by controlling a switching sequence of two transistor switches connected in series.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
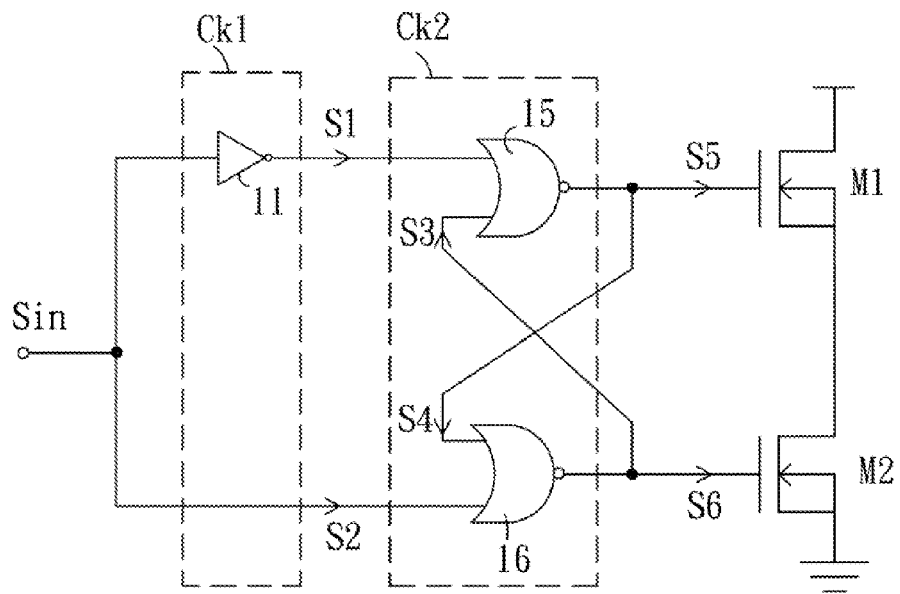
FIG. 1 is a schematic diagram of a circuit for restraining a shoot through current according to a first embodiment of the invention.

FIG. 1 is a schematic diagram of a circuit for restraining a shoot through current according to a first embodiment of the invention. A circuit for restraining shoot through current comprises a master selecting unit Ck1 and a logic unit Ck2, and is adapted to control two transistor switches M1 and M2 connected in series according to an input signal Sin. The master selecting unit Ck1 receives the input signal Sin, and generates a first master selecting signal S1 and a second master selecting signal S2 according to the input signal Sin. The logic unit Ck2 is coupled with the master selecting unit Ck1 and the transistor switches M1 and M2. The logic unit Ck2 generates a first control signal S5 and a second control signal S6 according to the first master selecting signal S1 and the second master selecting signal S2 for switching the transistor switches M1 and M2 between an ON state and an OFF state. In the present embodiment, both of the transistor switches M1 and M2 are the N-type MOSFETs.

The master selecting unit Ck1 comprises an inverter 11 which inverts the input signal Sin to the first master selecting signal S1. In the present embodiment, the master selecting unit Ck1 directly uses the input signal Sin as the output of the second master selecting signal S2. The logic unit Ck2 comprises a first logic element 15 and a second logic element 16. In the present embodiment, both of the first logic element 15 and the second logic element 16 are NOR gates, wherein the first logic element 15 receives the first master selecting signal S1 and a first trigger signal S3 and accordingly outputs the first control signal S5; and the second logic element 16 receives the second master selecting signal S2 and a second trigger signal S4 and accordingly outputs the second control signal S6. In the present embodiment, the first control signal S5 is used as the second trigger signal S4, and the second control signal S6 is used as the first trigger signal S3. In other words, the output end of the first logic element 15 is coupled with the input end of the second logic element 16, and the output end of the second logic element 16 is coupled with the input end of the first logic element 15.

The input signal Sin has a first logic level and a second logic level. In the below, the first logic level is considered as a high level and the second logic level is considered as a low level as an example for explanation. When the input signal Sin is at the high level, the second master selecting signal S2 is also at the high level, and the first master selecting signal S1 at the low level is outputted after the input signal Sin is inverted by the inverter 11. The characteristic of the NOR gate is that the output signal is at the low level if one of the input signals is at the high level. Therefore, when the second master selecting signal S2 is at the high level (meanwhile the input signal Sin is at the high level), the first master selecting signal S1 is at the low level and thus the logic level of the first control signal S5 outputted by the first logic element 15 is determined by the logic level of the first trigger signal S3, i.e., the second control signal S6. At the moment, the second logic element 16 h the second logic element 16 acquires a control privilege, i.e., the second logic element 16 determines the logic state of the first control signal S5 outputted by the first logic element 15. At this time, the second master selecting signal S2 is at the high level, and thus the second logic element 16 outputs the second control signal S6 with the low level to switch the transistor switch M2 off. Then, the first logic element 15 receives the first trigger signal S3 with the low level and the first master selecting signal S1 with the low level, and accordingly outputs the first control signal S5 with the high level to turn the transistor switch M1 on. When the input signal Sin is at the low level, the first master selecting signal S1 is at the high level and the second master selecting signal S2 is at the low level. At this time, the logic level of the second control signal S6 outputted by the second logic element 16 is determined by the logic level of the second trigger signal S4, i.e., the first control signal S5, and thus the first logic element 15 has the control privilege. Therefore, the first logic element 15 changes the logic state of the first control signal S5 outputted by the first logic element 15 to the low level, thereby switching the transistor switch M1 off and then triggering the second logic element 16 to change the logic state of the second control signal S6 to the high level to turn the transistor switch M2 on. Similarly, while the input signal Sin is changed from the low level into the high level, the transistor switch M2 is first switched off and then the transistor switch M1 is turned on.

As described above, when the input signal Sin is at the first logic level of high level, the second logic element 16 has the control privilege. When the input signal Sin is at the second logic level of low level, the first logic element 15 has the control privilege. The logic element in the logic unit Ck2 having the control privilege is determined in response to the logic level of the input signal Sin, so as to switch off one of the transistor switches M1 and M2 which is originally turned on, and then to turn on the other one of the transistor switches M1 and M2 which is originally turned off. Through the switching sequence described above, the probability for the transistor switches M1 and M2 to be turned on at the same time can be lowered, thus further preventing the shoot through current from occurring.

Figure 2:
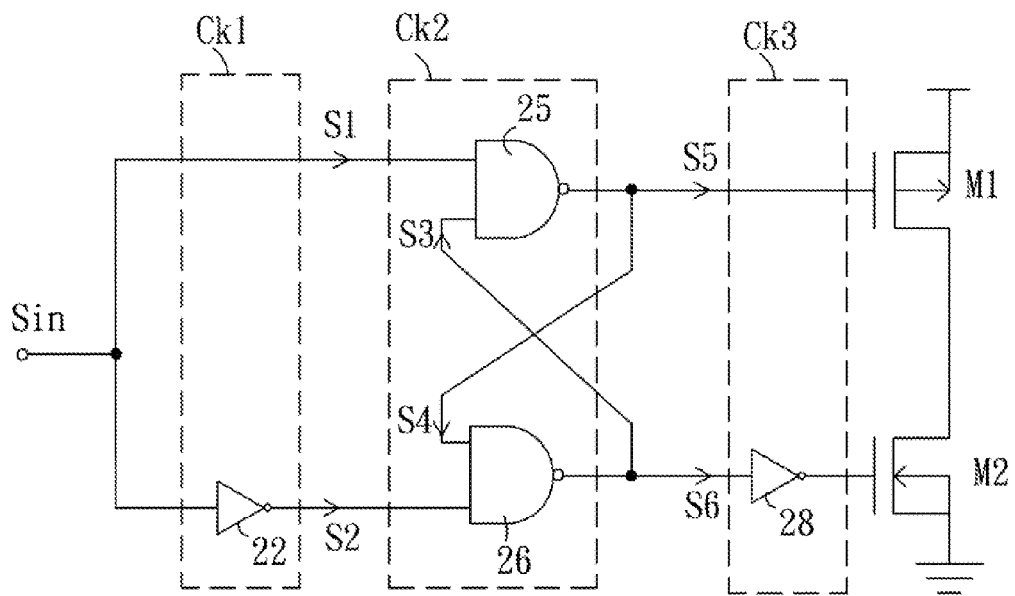
FIG. 2 is a schematic diagram of a circuit for restraining a shoot through current according to a second embodiment of the invention.

FIG. 2 is a schematic diagram of a circuit for restraining a shoot through current according to a second embodiment of the invention. The circuit for restraining shoot through current comprises a master selecting unit Ck1, a logic unit Ck2 and a driving unit Ck3, and is adapted to control two transistor switches connected in series according to an input signal Sin. The master selecting unit Ck1 receives the input signal Sin and generates a first master selecting signal S1 and a second master selecting signal S2 according to the input signal Sin. The logic unit Ck2 is coupled with the master selecting unit Ck1, and is coupled with the transistor switches M1 and M2 through the driving unit Ck3. The logic unit Ck2 generates the first control signal S5 and the second control signal S6 according to the first master selecting signal S1 and the second master selecting signal S2 to switch the states of the transistor switches M1 and M2 between ON and OFF. The driving unit Ck3 is coupled between the logic unit Ck2 and the transistor switches M1, M2, and is used to respectively adjust the states of the first control signal S5 and the second control signal S6 by corresponding to the types of the two transistor switches M1 and M2. In the present embodiment, the transistor switch M1 is the P-type MOSFET and the transistor switch M2 is the N-type MOSFET.

The master selecting unit Ck1 comprises an inverter 22, and directly uses the input signal Sin as the output of the first master selecting signal S1, and inverts the input signal Sin to the second master selecting signal S2 by using the inverter 22. The logic unit Ck2 comprises a first logic element 25 and a second logic element 26. In the present embodiment, both of the first logic element 25 and the second logic element 26 are NAND gates, wherein the first logic element 25 receives the first master selecting signal S1 and the first trigger signal S3, and accordingly outputs the first control signal S5. The second logic element 26 receives the second master selecting signal S2 and the second trigger signal S4 and accordingly outputs the second control signal S6. In the present embodiment, the first control signal S1 is used as the second trigger signal S4 and the second control signal S6 is used as the first trigger signal S3. In other words, an output end of the first logic element 25 is coupled with an input end of the second logic element 26, and an output end of the second logic element 26 is coupled with an input end of the first logic element 25. The driving unit Ck3 comprises an inverter 28 which is coupled with the second logic element 26 to invert the second control signal S6.

When the input signal Sin is at the high level, the first master selecting signal S1 is also at the high level, and the second master selecting signal S2 at the low level is outputted after the input signal Sin is inverted by the inverter 22. The characteristic of the NAND gate is that the output signal is at the high level if one of the input signals is at the low level. Therefore, when the input signal Sin is at the high level, the first master selecting signal S1 is at the high level and thus the logic level of the first control signal S5 outputted by the first logic element 25 is determined by the logic level of the first trigger signal S3, i.e., the second control signal S6. At the moment, the second logic element 26 has the control privilege. At this time, the second logic element 26 outputs the second control signal S6 with the high level, and the second control signal S6 is inverted by the inverter 28 of the driving unit Ck3 to switch the transistor switch M2 off. Then, the second control signal S6 is used as the first trigger signal S3 and is inputted to the first logic element 25. Therefore, the first logic element 25 receives the input signal Sin with the high level and the first trigger signal S3 with the high level, and thus outputs the first control signal with the low level to turn the transistor switch M1 on. When the input signal is changed from the high level to the low level, the second master selecting signal at the high level is outputted after the input signal Sin is inverted by the inverter 22, and thus the logic level of the second control signal S6 outputted by the second logic element 26 is determined by the logic level of the second trigger signal S4, i.e., the first control signal S5. At the moment, the first logic element 25 has the control privilege. Therefore, the first logic unit 25 outputs the first control signal S5 with the high level to switch the transistor switch M1 off. Then, the second logic element 26 receives the second trigger signal S4 with the high level and the second master selecting signal S2 with the high level, and thus outputs the second control signal S6 with the low level. The inverter 28 inverts the second control signal S6 to the high level to turn the transistor switch M2 on. Similarly, while the input signal Sin is changed from the low level to the high level, the transistor switch M2—is turned off first and then the transistor switch M1 is turned on.

As described above, the logic element in the logic unit Ck2 having the control privilege is determined in response to the logic level of the input signal Sin, so as to make one of the transistor switches M1 and M2 is turned off and then the other one thereof is turned on.

The circuit for restraining shoot through current shown in FIG. 1 can be added with a driving unit, similar to the circuit shown in FIG. 2, thereby driving different types of transistor switches. For example, in the first embodiment shown in FIG. 1, when the transistor switches M1 and M2 are changed to a P-type MOSFET and a N-type MOSFET respectively, an inverter can be added between the first logic element 15 and the transistor switch M1, thereby driving the switching of the transistor switches M1 and M2 accurately to prevent a shoot through current.

In the aforementioned circuits shown in FIG. 1 and FIG. 2, the first master selecting signal S1 and the second master selecting signal S2 outputted by the master selecting unit Ck1 can also be regarded as priority determining signals for determining which of the first logic element and the second logic level is a priority logic element according to the logic level of the input signal, wherein the priority logic element changes the logic level of output signal first, and then, the other logic element can be triggered by the priority logic element directly or through another scheme to change the logic state of the output signal. Herein, a circuit shown in FIG. 3 is used as an example for explanation.

Figure 3:
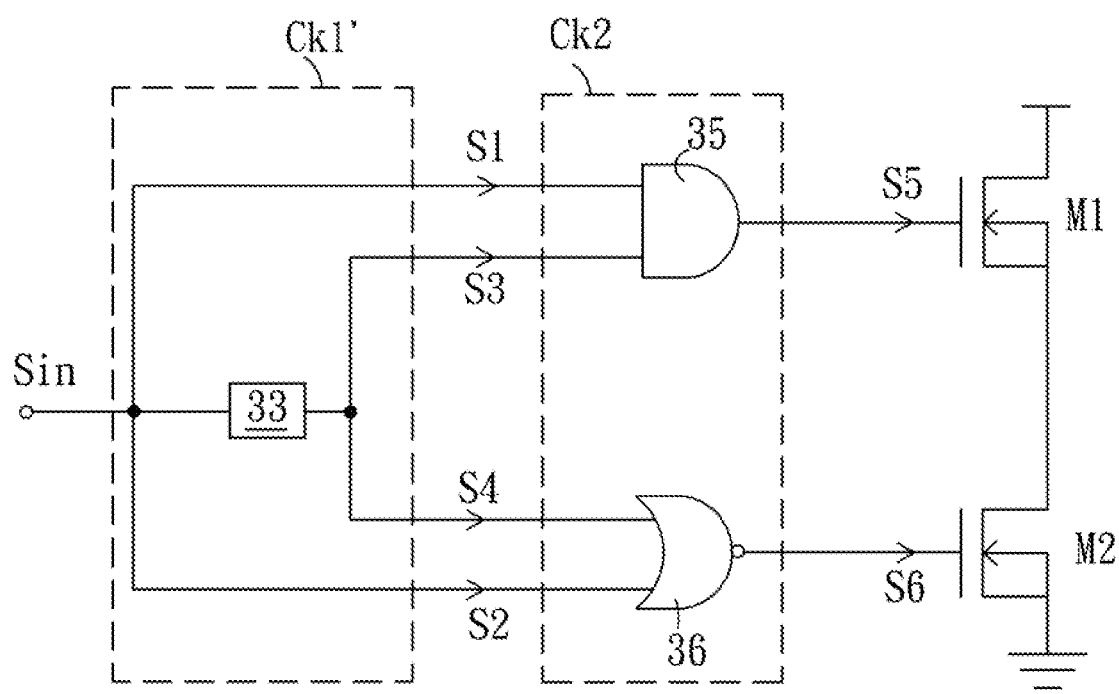
FIG. 3 is a schematic diagram of a circuit for restraining a shoot through current according to a third embodiment of the invention.

FIG. 3 is a schematic diagram of a circuit for restraining a shoot through current according to a third embodiment of the invention. The circuit for restraining shoot through current comprises a priority determining unit Ck1' and the logic unit Ck2, and is adapted to control two transistor switches M1, M2 connected in series in response to an input signal Sin. The priority determining unit Ck1' receives the input signal Sin and generates the first master selecting signal S1 and the second master selecting signal S2 according to the input signal Sin. The logic unit Ck2 is coupled between the priority determining unit Ck1' and the transistor switches M1, M2, and generates the first control signal S5 and the second control signal S6 according to the first master selecting signal S1 and the second master selecting signal S2 to control the transistor switches M1 and M2 to be ON or OFF. In the present embodiment, both of the transistor switches M1 and M2 are N-type MOSFETs.

The priority determining unit Ck1' comprises a delay circuit 33, and outputs the first master selecting signal S1 and the second master selecting signal S2 accordingly the input signal Sin. The delay circuit 33 receives the input signal Sin, and outputs it after a predetermined delay period. The delay circuit 33 outputs the first trigger signal S3 and the second trigger signal S4 to the logic unit Ck2. The logic unit Ck2 comprises a first logic element 35 and a second logic element 36. In the present embodiment, the first logic element 35 is an AND gate and the second logic element is a NOR gate. The first logic element 35 receives the first master selecting signal S1 and the first trigger signal S3, and outputs the first control signal S5. The second logic element 36 receives the second master selecting signal S2 and the second trigger signal S4, and outputs the second control signal S6. In addition, when the transistor switches M1, M2 are a P-type MOSFET and a N-type MOSFET respectively, the first logic element 35 has to be a NAND gate and the second logic element 36 has to be a NOR gate for correctly switching the transistor switch M1, M2 to prevent a shoot through current.

When the input signal Sin is at the high level, the first master selecting signal S1 and the second master selecting signal S2 are at the high level, too. As described above, the characteristic of the NOR gate is that the output signal is at the low level if one of the input signals is at the high level. Therefore, when the second master selecting signal S2 is at the high level, the second logic element 36 has the control privilege, i.e., the second logic element 36 can have the priority to change the logic state of the second control signal S6. Therefore, the second logic element 36 outputs the second control signal S6 with the low level to switch off the transistor switch M2. Then, the first trigger signal S3 and the second trigger signal S4, which are delayed with a predetermined delay period after the input signal Sin is received by the delay circuit 33, are inputted to the first logic element 35 and the second logic element 36 respectively. At this time, the first logic element 35 is triggered by the first trigger signal S3 to output the first control signal S5 with the high level, thereby turning on the transistor switch M1. When the input signal Sin is changed to the low level, both of the first master selecting signal and the second master selecting signal S2 are at the low level, too. The characteristic of the NAND gate is that the output signal is at low level if one of the input signals is at low level. The first logic element 35 has the control privilege at this time. Therefore, the first logic element 35 first changes the logic state of the first control signal S5 to the low level to switch off the transistor switch M1. Then, the first trigger signal S3 and the second trigger signal, which are delayed with a predetermined delay period after that the input signal Sin is received by the delay circuit 33, are inputted to the first logic element 35 and the second logic element 36 respectively. At this time, the second logic element 36 is triggered by the second trigger signal S4 with the low level to output the second control signal S6 with the high level, thereby turning on the transistor switch M2. Similarly, while the input signal Sin is changed from the low level to the high level, the transistor switch M2 can be switched off first and then the transistor switch M1 is turned on.

Therefore, the invention controls the switching sequence of the two transistor switches connected in series to avoid the two transistor switches simultaneously being turned on, so as to protect the two transistor switches from being damaged due to too large shoot through current or prolonged switching time.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A circuit for restraining a shoot through current, the circuit comprising:
   a master selecting unit used for receiving an input signal that is at a first logic level or a second logic level and outputting a first master selecting signal and second master selecting signal in response to the input signal; and
   a logic unit, comprising a first logic element and a second logic element, wherein the first logic element and the second logic element respectively generate a first control signal and a second control signal for controlling two transistor switches connected in series, and change logic states of the first control signal and second control signal respectively according to the first master selecting signal and the second master selecting signal; and the first logic element and the second logic element are NOR gates or the first logic element and the second logic element are NAND gates;
   wherein when the input signal is at the first logic level, the first logic element changes the logic state of the first control signal to trigger the second logic element to change the logic state of the second control signal; and when the input signal is at the second logic level, the second logic element changes the logic state of the second control signal to trigger the first logic element to change the logic state of the first control signal.

2. The circuit for restraining the shoot through current according to claim 1, wherein the transistor switch corresponding to the first logic element is turned off when the input signal is at the first logic level, and the transistor switch corresponding to the second logic element is turned off when the input signal is at the second logic level.

3. The circuit for restraining the shoot through current according to claim 2, wherein the master selecting unit comprises an inverter which is used to invert an input signal to one of the first master selecting signal and the second master selecting signal.

4. The circuit for restraining the shoot through current according to claim 3, further comprising a driving unit, wherein the driving circuit is coupled between the logic unit and the two transistor switches, and is adapted to adjust the logic states of the first control signal and the second control signal in response to types of the two transistor switches.

5. The circuit for restraining the shoot through current according to claim 3, wherein output ends of the first logic element and the second logic element are coupled with input ends of the first logic element and the second logic element respectively, such that one of the first logic element and the second logic element first changes the logic state of the corresponding control signal, and then triggers the other one of the first logic element and the second logic element to change the logic state of the corresponding control signal.

6. The circuit for restraining the shoot through current according to claim 2, further comprising a driving unit, wherein the driving unit is coupled between the logic unit and the two transistor switches, and is adapted to adjust the logic states of the first control signal and the second control signal in response to types of the two transistor switches.

7. The circuit for restraining the shoot through current according to claim 2, wherein output ends of the first logic element and the second logic element are coupled with input ends of the first logic element and the second logic element respectively, such that one of the first logic element and the second logic element first changes the logic state of the corresponding control signal, and then triggers the other one of the first logic element and the second logic element to change the logic state of the corresponding control signal.

8. A circuit for restraining a shoot through current, comprising:
   a logic unit, comprising a first logic element and a second logic element, wherein the first logic element and the second logic element respectively generate a first control signal and a second control signal for controlling two transistor switches connected in series; and
   a priority determining unit used for receiving an input signal that is at a first logic level or a second logic level and determining that one of the first logic element and the second logic element is a priority logic element according to the logic level of the input signal so as to make the priority logic element change the logic state of the corresponding control signal to switch the corresponding transistor switch off, the priority determining unit comprising a delay circuit which delays the input signal for a predetermined time period to trigger the other logic element to change the logic state of the corresponding control signal to turn the corresponding transistor on.

9. The circuit for restraining the shoot through current according to claim 8, wherein the first logic element and the second logic element are AND gates and NOR gates, respectively.

10. The circuit for restraining the shoot through current according to claim 8, further comprising a driving unit, wherein the driving unit is coupled between the logic unit and the two transistor switches, and are adapted to adjust the logic states of the first control signal and the second control signal in response to types of the two transistor switches.

11. The circuit for restraining the shoot through current according to claim 8, wherein output ends of the first logic element and the second logic element are coupled with input ends of the first logic element and the second logic element to first make the priority logic element change the logic state of the corresponding control signal and then trigger the other logic element to change the logic state of the corresponding control signal.

12. The circuit for restraining the shoot through current according to claim 11, further comprising a driving unit, wherein the driving unit is coupled between the logic unit and the two transistor switches, and is adapted to adjust the logic states of the first control signal and the second control signal in response to types of the two transistor switches.

13. The circuit for restraining the shoot through current according to claim 8, wherein the first logic element and the second element are NOR gates or NAND gates.

* * * * *